United States Patent
Huang et al.

(10) Patent No.: US 10,605,584 B2
(45) Date of Patent: Mar. 31, 2020

(54) MAGNETIC DETECTION METHOD

(71) Applicant: QUANTA COMPUTER INC., Taoyuan (TW)

(72) Inventors: Chih-Chia Huang, Taoyuan (TW); Cheng-Shian Yan, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 165 days.

(21) Appl. No.: 15/887,337

(22) Filed: Feb. 2, 2018

(65) Prior Publication Data
US 2019/0242688 A1 Aug. 8, 2019

(51) Int. Cl.
*G01B 7/04* (2006.01)
*G01B 7/14* (2006.01)
(Continued)

(52) U.S. Cl.
CPC ............ *G01B 7/003* (2013.01); *G01D 5/12* (2013.01); *G01D 5/14* (2013.01); *G01D 5/145* (2013.01); *G01D 11/245* (2013.01); *G01R 33/02* (2013.01); *H05K 7/20172* (2013.01); *G01B 7/023* (2013.01); *G01B 7/14* (2013.01); *G01B 7/30* (2013.01)

(58) Field of Classification Search
CPC ........ G01D 5/145; G01D 11/245; G01D 5/12; G01D 5/14; G01B 7/14; G01B 7/003; G01B 7/30; G01B 7/023
USPC ................ 324/51, 55, 200, 207.11
See application file for complete search history.

(56) References Cited

U.S. PATENT DOCUMENTS

2014/0361671 A1* 12/2014 Degner .................. G06F 1/20
312/223.2
2016/0178925 A1* 6/2016 Park ..................... H04N 5/2254
359/557
(Continued)

FOREIGN PATENT DOCUMENTS

JP   H10178768    * 6/1998 ............... H02K 1/18
JP   H10178768 A    6/1998
JP   2008250835 A   10/2008

OTHER PUBLICATIONS

JP Office Action for Application No. 2018-229883, dated Nov. 26, 2019, w/ First Office Action Summary.
(Continued)

*Primary Examiner* — Raul J Rios Russo
(74) *Attorney, Agent, or Firm* — Nixon Peabody LLP; Zhou Lu

(57) ABSTRACT

A computing device includes a first component comprising a magnetic field sensor with a sensing region and a second component comprising a magnetic portion. The computing device also includes a controller communicatively coupled to the magnetic field sensor. In the computing device, the second component is movable between a first position relative to the first component, and one or more second positions relative to the first component, whereby the magnetic portion is positioned in the sensing region when the sensing portion is in the first position. The magnetic field sensor is configured for generating one or more first signals in response to detecting the magnetic portion within the sensing region. The controller is configured for generating a second signal in response to the first signals indicating the second component is in the first position.

18 Claims, 6 Drawing Sheets

(51) Int. Cl.
*G01B 7/30* (2006.01)
*G01R 33/00* (2006.01)
*G01B 7/00* (2006.01)
*G01R 33/02* (2006.01)
*H05K 7/20* (2006.01)
*G01D 5/14* (2006.01)
*G01D 5/12* (2006.01)
*G01D 11/24* (2006.01)
*G01B 7/02* (2006.01)

(56) References Cited

U.S. PATENT DOCUMENTS

| | | | |
|---|---|---|---|
| 2018/0088690 A1* | 3/2018 | Seo | G06F 1/169 |
| 2018/0120956 A1* | 5/2018 | Yoo | H05K 1/147 |
| 2018/0239164 A1* | 8/2018 | Park | H04N 5/2252 |

OTHER PUBLICATIONS

Extended European Search Report for EP Application No. 18212938.7, dated Jul. 30, 2019.

* cited by examiner

MAGNETIC DETECTION METHOD

FIELD OF THE INVENTION

The present invention relates to apparatus and methods for detecting components and configurations using magnetic sensing systems.

BACKGROUND

Although the structure of certain types of computing devices is relatively straightforward, assembly and maintenance of such computing devices are not trivial. For example, in the case of a server system, proper placement and configuration of fan components can be critical. Not only must a fan component be properly placed within a chassis of the server system, but it must also be the correct fan. However, because assembly and maintenance of server systems typically relies on a human technician, insertion of the incorrect fan component is a strong possibility due to human error.

For example, a fan component must be configured to have the correct fan direction for the particular server system. Typically, fan components are labeled with identifying information so that the technician can properly identify the fan component, and verify whether it is suitable for a server system of interest. However, if a user ignores or misreads the identifying information, then a wrong fan component can be installed in the server system.

One solution to these types of problems is an internal checking system, as illustrated in FIG. 1. FIG. 1 shows a schematic diagram of a server system 100 configured for the hot-swapping of fan components. In particular, system 100 consists of a chassis 102 having a circuit board 104, such as a motherboard or other main board, disposed therein. The chassis 102 also includes components 106 insertable into chassis 102. As shown in FIG. 1, the components 106 each consist of one or more fans 108. Connectors 110 can be provided to electrically connect the components 108 to the circuit board 104. The connectors 110 can then be communicatively connected to a controller 112 (sometimes via an input/output (I/O) component 114) and other components disposed on the circuit board 104. To provide the internal checking, the fan 108 can provide signals indicating the presence of the fan (e.g., Fan Present1, Fan Present2). Furthermore, additional signals can also be provided to indicate a fan direction or other operational features of the fan. Based on these signals, the controller 112 can determine whether an error signal should be generated to indicate an incorrect fan configuration.

While systems such as those shown in FIG. 1 help in reducing installation errors, such system configurations have several drawbacks. First, additional electronics (e.g., memory) must be added to the component to store the requested information. Second, the number of lines for the connector and the circuit board must be increased to support such signals. Accordingly, such systems increase the complexity of server systems.

SUMMARY

Embodiments of the invention concern systems and methods for detecting components in computing systems and configurations thereof using magnetic sensing systems A computing device according to a first embodiment includes a first component having a magnetic field sensor with a sensing region, a second component having a magnetic portion, and a controller communicatively coupled to the magnetic field sensor. In the computing device, the second component is movable between a first position relative to the first component and one or more second positions relative to the first component. The magnetic portion is positioned in the sensing region when the sensing portion is in the first position. The magnetic field sensor is configured for generating one or more first signals in response to detecting the magnetic portion within the sensing region. Further, the controller is configured for generating a second signal in response to the first signals, thereby indicating the second component is in the first position.

In some configurations, the second component can be detachable from the first component. Alternatively or additionally, the second component can be rotatable relative to the first component.

In some configurations, the magnetic field sensor is further configured for detecting a polarity of the magnetic portion. The one or more first signals can then be configured to indicate a polarity of the magnetic portion. The controller can generate the second signals in a first configuration, in response to the first signals indicating a first polarity for the magnetic portion. The controller can also generate the second signals in a second configuration in response to the first signals indicating a second polarity for the magnetic portion. The controller can further be configured for detecting that the second signals fail to match a target polarity signal. Additionally, the controller can generate an error signal when the second signals fail to match the target polarity signal.

In some configurations, the magnetic field sensor is configured for generating one or more third signals in response to failing to detect the magnetic portion in the sensing region. Further, the controller can be configured for generating a fourth signal in response to the third signals indicating that the second component is not in the first position.

A method according to a second embodiment is directed to detecting a configuration of a computing device. The computing device can include a first component having a magnetic field sensor with a sensing region and a second component having a magnetic portion. The second portion is configured to be movable between a first position and one or more second positions, relative to the first component, such that the magnetic portion is positioned in the sensing area when the second component is in the first position. The method includes receiving from the magnetic field sensor, one or more first signals indicating a presence of the magnetic portion within the sensing region. The method also includes detecting receipt of the first signals and generating one or more second signals in response to the first signals to indicate the second component is in the first position.

In some configurations, the magnetic field sensor is further configured for detecting a polarity of the magnetic portion, where the one or more first signals further indicate a polarity of the magnetic portion. Thus, the detecting can include identifying a polarity of the magnetic portion based on the first signals.

In the method, the second signals can be generated in a first configuration, in response to the first signals, to indicate a first polarity for the magnetic portion. Further, the second signals can be generated in a second configuration in response to the first signals indicating a second polarity for the magnetic portion. The method can also include detecting that the second signals fail to match a target polarity signal and generating an error signal when the second signals fail to match the target polarity signal.

In some configurations, the magnetic field sensor is configured for generating one or more third signals in response to failing to detect the magnetic portion in the sensing region. The method further comprises generating a fourth signal in response to the third signals to indicate that the second component is not in the first position.

A computing device according to a third invention includes a chassis having at least one receiving space for receiving a component, a circuit board disposed in the chassis, and a controller disposed on the circuit board. The computing device also includes at least one board connector disposed on the circuit card, where the board connector is configured to mate with a connector of a component inserted into the receiving space. Further, the computing device also includes a magnetic field sensor disposed on the circuit board and communicatively coupled the controller. In the computing device, the magnetic field sensor has a sensing region extending into a portion of the receiving space that corresponds to a position of a magnetic portion of a component when the component is fully inserted into the receiving space.

In the computing device, the magnetic field sensor is configured for generating one or more first signals in response to detecting the magnetic portion within the sensing region. The controller is configured for generating a second signal in response to the first signals to indicate the second component is in the first position.

In some configurations, the magnetic field sensor is further configured for detecting a polarity of the magnetic portion. Further, the first signals are configured to indicate a polarity of the magnetic portion.

In the computing device, the controller can be configured to generate the second signals in a first configuration, in response to the first signals indicating a first polarity for the magnetic portion. Further, the controller can be configured to generate the second signals in a second configuration, in response to the first signals indicating a second polarity for the magnetic portion. The controller can be further configured for detecting that the second signals fail to match a target polarity signal for the component, and for generating an error signal in response to detecting that the second signals fail to match the target polarity signal.

In some configurations, the component is a fan, and the target polarity signal indicates a direction required for the fan in the computing device.

In some configurations, the magnetic field sensor is configured for generating one or more third signals in response to failing to detect the magnetic portion in the sensing region. Further, the controller can be configured for generating a fourth signal in response to the third signals indicating that the component is absent.

DETAILED DESCRIPTION

Figure 1:
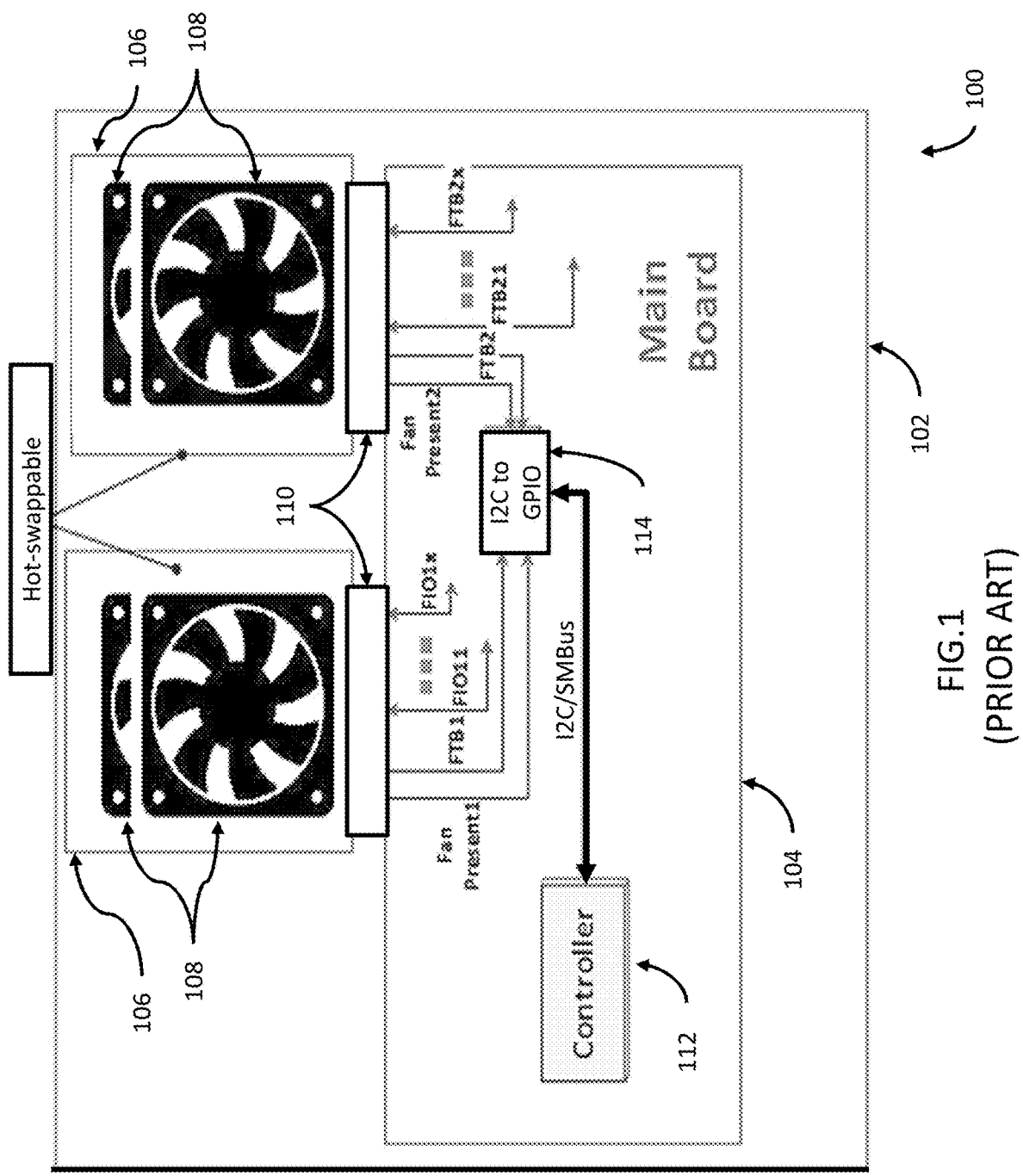
FIG. 1 shows a schematic diagram of a server system 100 configured for hot-swapping of fan components that is useful for describing the various embodiments.

The present invention is described with reference to the attached figures, in which like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As noted above, there are various disadvantages with current system and methods for the detecting the presence and configuration of components installed into computer systems. Accordingly, the various embodiments are directed to systems and methods for providing an alternative to such systems and methods. In particular, the various embodiments utilize an arrangement of magnetic field sensors in the computer system, and corresponding magnetic portions in the components, to detect the presence and configuration of components installed into computer system. This is schematically illustrated in FIGS. 2A and 2B.

Figure 2A:
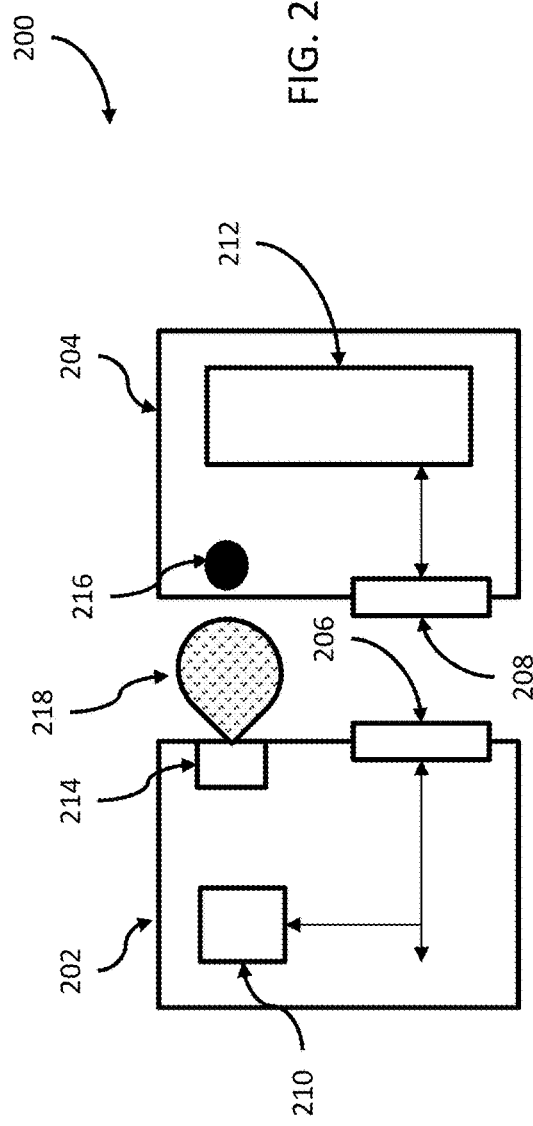
FIGS. 2A and 2B show a schematic of components of a computer system 200 in an uninstalled and installed configuration, respectively.
Figure 2B:
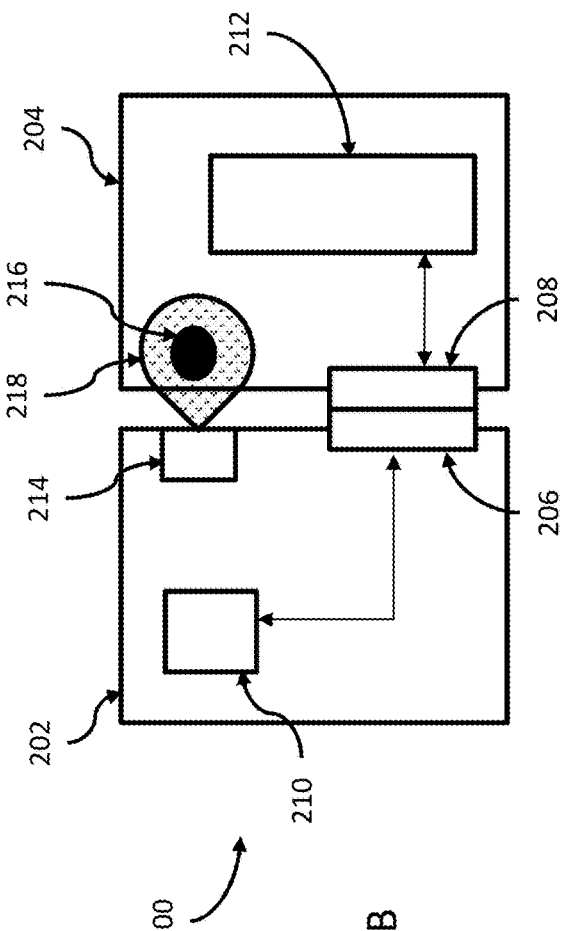

FIGS. 2A and 2B show a schematic of components of a computer system 200 in an uninstalled and installed configuration, respectively. As shown in FIGS. 2A and 2B, the system 200 consists of a first component 202 and a second component 204.

The first component 202 can be, for example, a circuit board installed in a chassis (not shown) of a computer system 200. In some embodiments, the first component 202 can be a motherboard or main board of the computer system 200. The first component 202 can have installed thereon a connector 206 for connecting to a matching connector 208 of the second component 204. The connector 206 can be communicably coupled to a controller 210 disposed in the first component 202 or other components of the computer system 200, disposed in the first component or connected to the first component 202.

The second component 204 can be any component to be added to computer system 200. For example, a fan component can be installed into the computer system 200. The second component 204 can have incorporated therein, as noted above, a connector 208 for connecting to a matching connector 206 of the first component 202. The connector 208 can be communicably coupled to operating components 212 of the second component 204. For example, if the second component 204 is a fan, the operating components 212 can be a motor for the fan.

While the various embodiments will be primarily discussed with respect to adding a fan component to a computer system, this is solely for ease of illustration. Rather, the various embodiments can be used with respect to any other type of component to be added to a computer system.

As noted above, an issue with conventional means for detecting the presence and configuration of components in a computer system is the additional complexity required in the computer system and the component. Thus, to reduce such complexity issues, the computer system 200 can include a magnetic sensing system.

Further, there is a concern with using a conventional push button design for indicating that a component has been received or removed. In particular, since a push button is mechanical structure, it is susceptible to mechanical failure when used to many times. In contrast, a magnetic sensor design is not typically susceptible to mechanical failure and thus can have a significantly higher lifetime than push button designs.

In the various embodiments, the magnetic sensing system can include two parts: a magnetic field sensor 214 at the first component 202 and a magnetic portion 216 at the second component 204. The magnetic field sensor 214 can be any sensor configured to at least detect the presence of a magnetic field in a sensing area 218. For example, as shown in FIG. 2B, the magnetic field sensor 214 can detect the magnetic field generated by magnetic portion 216 when magnetic portion 216 is in the sensing area 218. Further, the magnetic field sensor 214 is communicatively coupled (directly or indirectly) to the controller 210.

The magnetic portion 216 can be a magnet or any other element capable of generating a magnetic field. For example, the magnetic coil can be a coil or the like that generates a magnetic field when energized by power supplied to the component. The magnetic portion 216 can be mounted on a surface of the second component 204 or embedded therein. However, the magnetic portion 216 is positioned so that when the second component 204 is connected to the first component 202, the magnetic portion 216 lies in sensing area 218, as shown in FIG. 2A.

In particular embodiments, magnetic field sensor 214 can operate as follows. As noted above, the magnetic field sensor 214 monitors the sensing area 218, and generates signals based on the magnetic field detected in the sensing area 218. These signals are then passed to the controller 210 for further processing. In some embodiments, the signals are passed directly to the controller 210. In other embodiments, the signals may be pre-processed for controller 210 by circuitry within magnetic field sensor 214, or some other circuitry in the first component 202. Based on the signals received at controller 210, the controller 210 can then take various actions. For example, if no field is detected by magnetic field sensor 214 in sensing area 218 and corresponding signals have been received at controller 210, then the controller 210 can generate a signal, or some other indication for a user, that notifies the user of a component that is missing and/or inserted incorrectly. In contrast, if a field is detected by magnetic field sensor 214 in sensing area 218 and corresponding signals have been received at controller 210, then the controller 210 can generate a signal indicating that component present.

In some embodiments, the type of sensor used for magnetic field sensor 214 can determine the type of signals being generated. For example, in some cases, the magnetic field sensor 214 can not only determine the presence of a magnetic field, but also the polarity of the magnetic field. In the various embodiments, such a sensor can be used advantageously. For example, fan components can be configured so that the polarity is based on fan direction. That is, for fans with airflow in a first direction, the magnet is arranged to provide a magnetic field with a first polarity. For fans with airflow in a second direction, the magnet is arranged to provide a magnetic field with a second polarity. As such, the magnetic field sensor 214 would be capable of generating signals that not only indicate whether or not a fan component is present, but also the direction of the fan component. Based on such signals, a controller 210 can then indicate to a user three possibilities: (1) no fan present; (2) fan present and having a correct direction; and (3) fan present and having an incorrect direction. In some configurations, the signals can be used to generate simply an error signal. That is, the controller 210 may be provided with a target polarity and generate an error signal when the polarity, as detected, does not match the target polarity.

The advantage of the foregoing configuration, the inclusion of a magnetic field sensor in a computer system and a corresponding magnetic portion in the component, is relatively less complicated than conventional methods. That is, incorporating the necessary circuitry and wiring into the computer system and the components to be inserted into the computer system to support the additional signals through connectors is non-trivial. Furthermore, magnetic field sensors are typically compact, and can be easily incorporated without any significant space requirements.

For example, referring back to FIGS. 2A and 2B, inclusion of magnetic portion 216 in component 204 does not require any type of wiring or other circuitry to connector 208. In fact, in some cases (e.g., where a magnet is used), no wiring or circuitry is required in the component 204. Rather, a magnet is simply placed at convenient location in component 204. At the most, if a coil or other element is used to generate the magnetic field, the only additional components are the coil and wires to energize the coil. However, no additional wiring via the connector 208 is needed. Further, a conventional configuration (non-sensing configuration) for connector 208 can be used for the component 204. In this way, the component 204 can be used with computer systems including or excluding magnetic field sensor 214. Consequently, component 204 can be backward compatible with computer systems with conventional connectors (albeit without the sensing capabilities).

At the computing system, the component 202 merely requires placement of magnetic field sensor 214 at a convenient location and any necessary wiring for magnetic field sensor 214. Although wiring would still be needed in component 202, the fact that no extra wiring is needed for connector 206 eases the complexity of the design of component 202. That is, since the wiring for the magnetic field sensor 214 does not need to be incorporated into connector 206, there is no need for a circuit board in component 202 to be designed to accommodate additional wiring between controller 210 and connector 206. Rather, the magnetic field sensor 214 can be positioned at a convenient location, and relatively simple wiring can be provided to connect the magnetic field sensor 214 to controller 210. In fact, in some embodiments, there may be no need to provide any wiring between controller 210 and connector 206, thereby further simplifying the configuration of component 202. Further, since no extra wiring would be required for connector 206, a conventional configuration (non-sensing configuration) for connector 206 can used for the component 202. In this way, the component 202 can be used with components including or excluding magnetic portion 216. Consequently, component 202 can be backward compatible with components with conventional connectors (albeit without the sensing capabilities).

Figure 3:
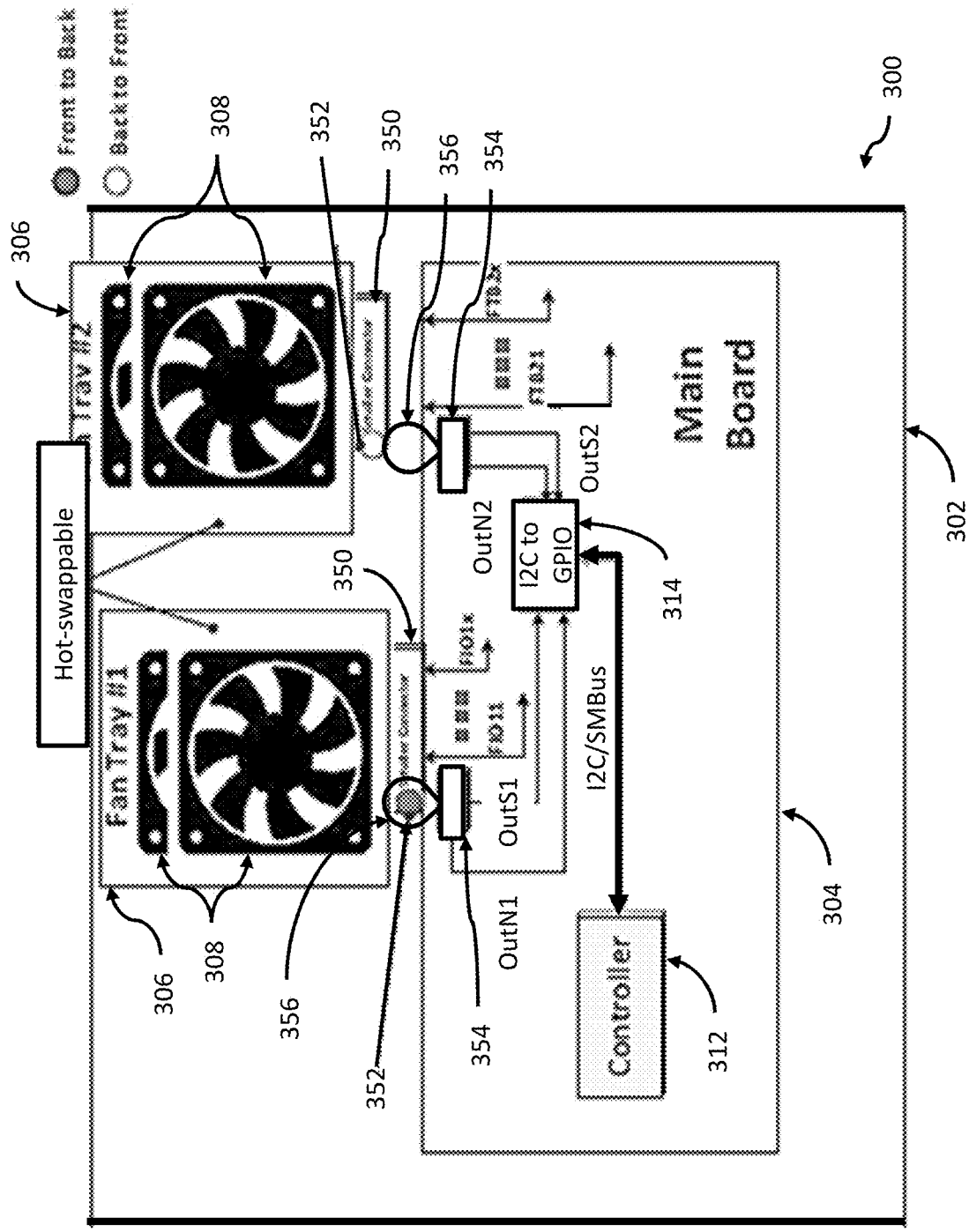
FIG. 3 shows a schematic diagram of a server system 300 configured for hot-swapping of fan components and using magnetic sensing, in accordance with an embodiment.

An example of how the configuration of FIGS. 2A and 2B can be used to simplify design of a computer system is shown in FIG. 3. FIG. 3 shows a schematic diagram of a server system 300 configured for hot-swapping of fan components and using magnetic sensing, in accordance with an embodiment. In particular, system 300 is substantially similar to that of system 100 in FIG. 1. Accordingly, the description of elements 102, 104, 106, 108, 112, and 114 provided above with respect to FIG. 1 is sufficient for describing elements 302, 304, 306, 308, 312, and 314 in FIG. 3.

Turning now to FIG. 3, system 300 is configured substantially similar to system 200 in FIGS. 2A and 2B. That is, in addition to the components discussed above, system 300 is also configured to utilize magnetic sensing to detect the presence of components 306. Additionally, such sensing can be used to detect whether fans 308 provide airflow in a correct direction. In particular, system 300 is configured with a "basic" connector 350. That is a connector that is not configured to provide any extra type of information for controller 312, such as polarity and/or presence information. Rather, such a connector would be limited to typical signals, such as fan power and fan control signals. As discussed above, connector 350 can therefore be a conventional connector, as used in computer systems with any type of sensing.

The system 300 also includes a magnetic portion 352, as described above with respect to FIGS. 2A and 2B. In the exemplary configuration of FIG. 3, magnetic portions 352 can be provided via a magnet embedded in each of components 306. However, a coil or the like can also be used to generate the magnetic field, as described above.

The system 300 also includes magnetic field sensors 354, each having a sensing area 356, as described above with respect to FIGS. 2A and 2B. In the exemplary embodiment of FIG. 3, each of the sensors 352 is configured to generate two output signals, each representing whether or not a magnetic field of a particular polarity has been detected in the sensing area 356. The first signal OutNx (where x=1 or 2) is configured to provide a signal indicating whether or not a magnetic field of a north or negative polarity is present in the sensing area 356. The second signal OutSx (where x=the identifier for the sensor) is configured to provide signal indicating whether or not a magnetic field of a south or positive polarity is present in the sensing area 356. Together, these two signals can be used to characterize the magnetic portion 352, and thus the configuration of a corresponding component 306. For example, assuming OutSx=0 when a positive field is detected and OutNx=0 when a negative field is detected, the presence and configuration of the component 306 can be discerned as follows:

| OutNx | OutSx | Result |
|---|---|---|
| 0 | 0 | Error (Both fields would not be present) |
| 0 | 1 | Front-to-back airflow (positive field detected) |
| 1 | 0 | Back-to-front airflow (negative field detected) |
| 1 | 1 | Fan not inserted (no field detected) |

The OutNx and OutSx signals can then be used by controller 312 to determine whether a fan is present, and/or whether a fan with a correct airflow direction is present. As discussed above, the signals can be used to report a configuration or simply to generate an error signal.

As shown in FIG. 3, the magnets 352 and sensors 354 can be positioned proximate to the connectors 350. However, the various embodiments are not limited in this regard. Rather, one of the advantages of the various embodiments is that the magnetic sensing system and the connectors need not be proximate. Rather, the elements of the magnetic sensing system can be positioned as needed in the computer system 300, for ease of placement and connection to the controller 312.

Moreover, the various embodiments illustrate only a single magnetic portion 352 and a single magnetic field sensor 354 for each of components 306. However, the various embodiments are not limited in this regard. In some embodiments, multiple magnets and sensors can be used with each component to provide additional information to controller 312. As shown above, a single magnet and a single sensor can be used to represent two bits (OutNx, OutSx). Thus, by adding one or more additional pairs of magnets and sensors, additional bits can be provided. Such bits can be used to represent additional information that might be useful for proper installation, such as rated speed, airflow, or noise level, to name a few. The pairs of magnets and sensors can be positioned so as not to affect other pairs.

As noted above, although FIG. 3 is discussed with respect to fan components in a server system, the invention is not limited in this regard. Rather, the same principles used in FIG. 3 can be used in a substantially similar way to obtain configuration information for any other type of component being inserted into any other type of computing device.

In some embodiments, the computing device can be a tool device for evaluating a component. Such a tool device can include only the components needed for detecting the magnetic portions in a component, i.e., the magnetic field sensors, a controller, and display or other readout. Thus, the tool device can be configured to receive a component, such as component 306 and "read" the information being stored magnetically. The tool device can also be configured to show the user of the tool device the configuration of the component 306.

The methodology of FIGS. 2A, 2B, and 3 is primarily directed to components that can be separated or removed from a computing device. However, the various embodiments are not limited in this regard. In some embodiments, the same methodology can be used to detect the position and configuration of non-removable components or components that can be partially removed. This is illustrated below with respect to FIGS. 4, 5A, and 5B.

Figure 4:
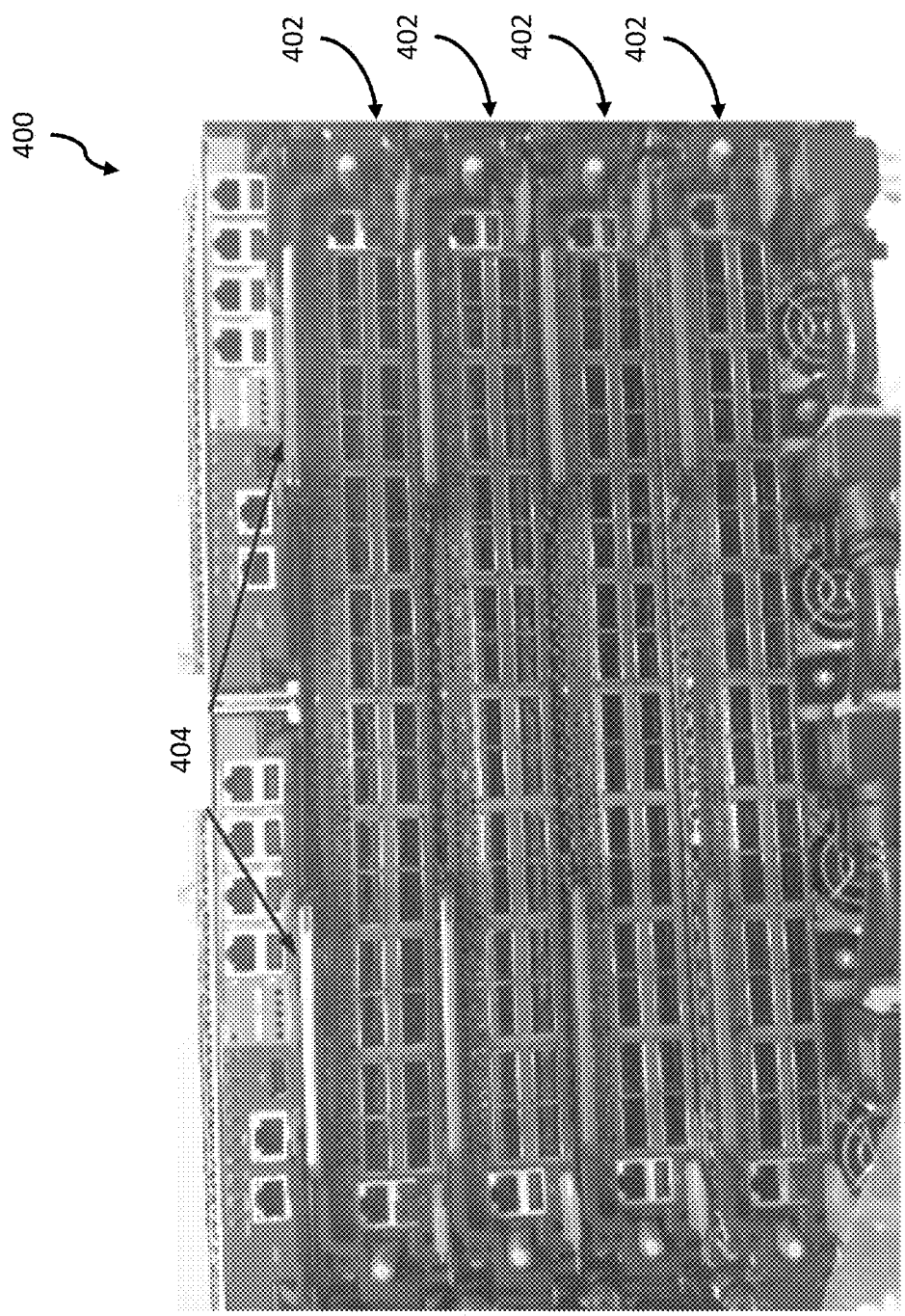
FIG. 4 is a front view of a server chassis configured in accordance with an embodiment.

FIG. 4 is a front view of a server chassis 400 configured in accordance with an embodiment. As shown in FIG. 4, the server chassis 400 includes multiple server sleds 402 that can each slide in and out of chassis 400. Each of the server sleds 402 also includes a pair of sled levers 404.

Figure 5A:
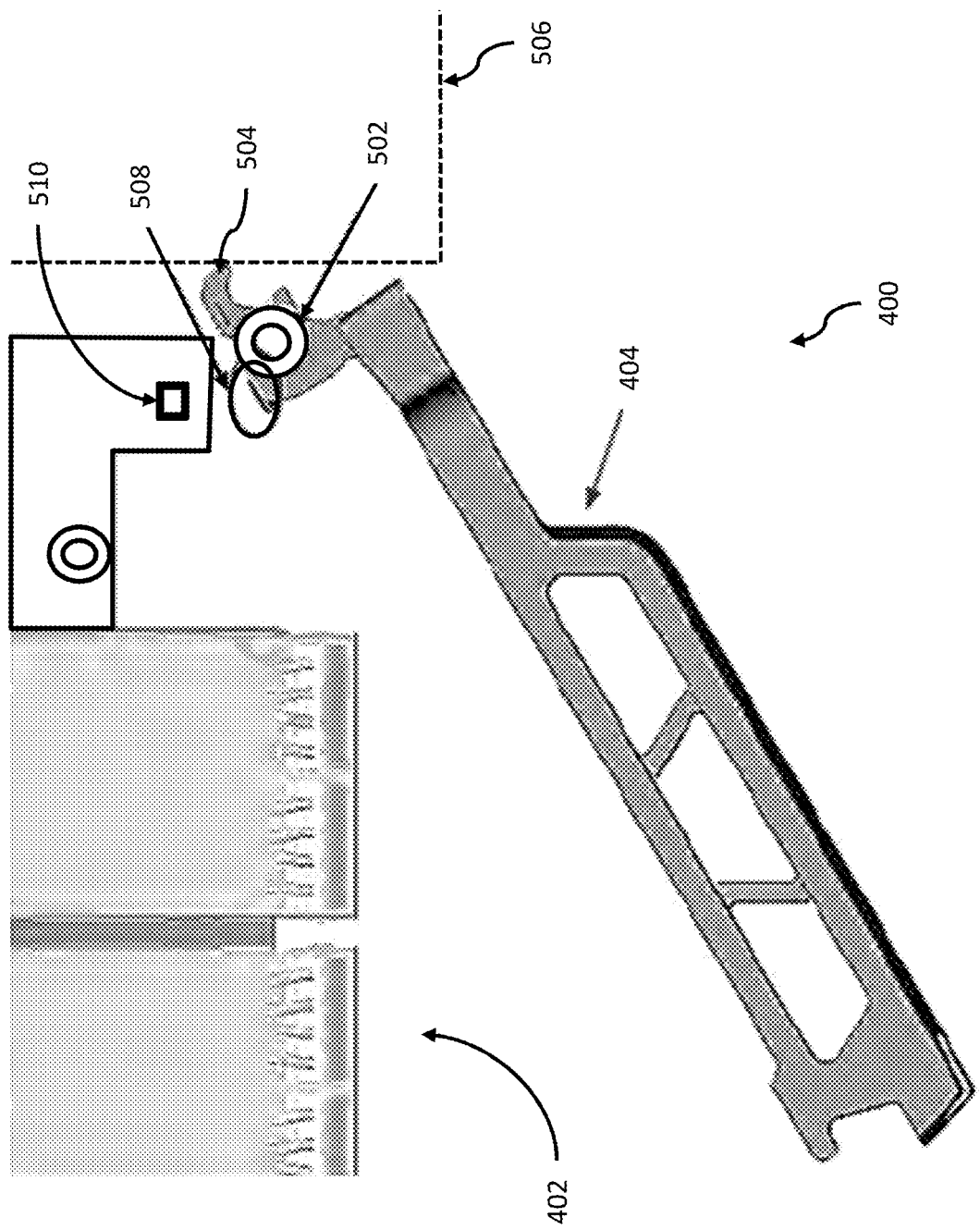
FIGS. 5A and 5B show a close-up view of a portion of one of the server sleds from FIG. 4 with a lever in an open position and a closed position, respectively.
Figure 5B:
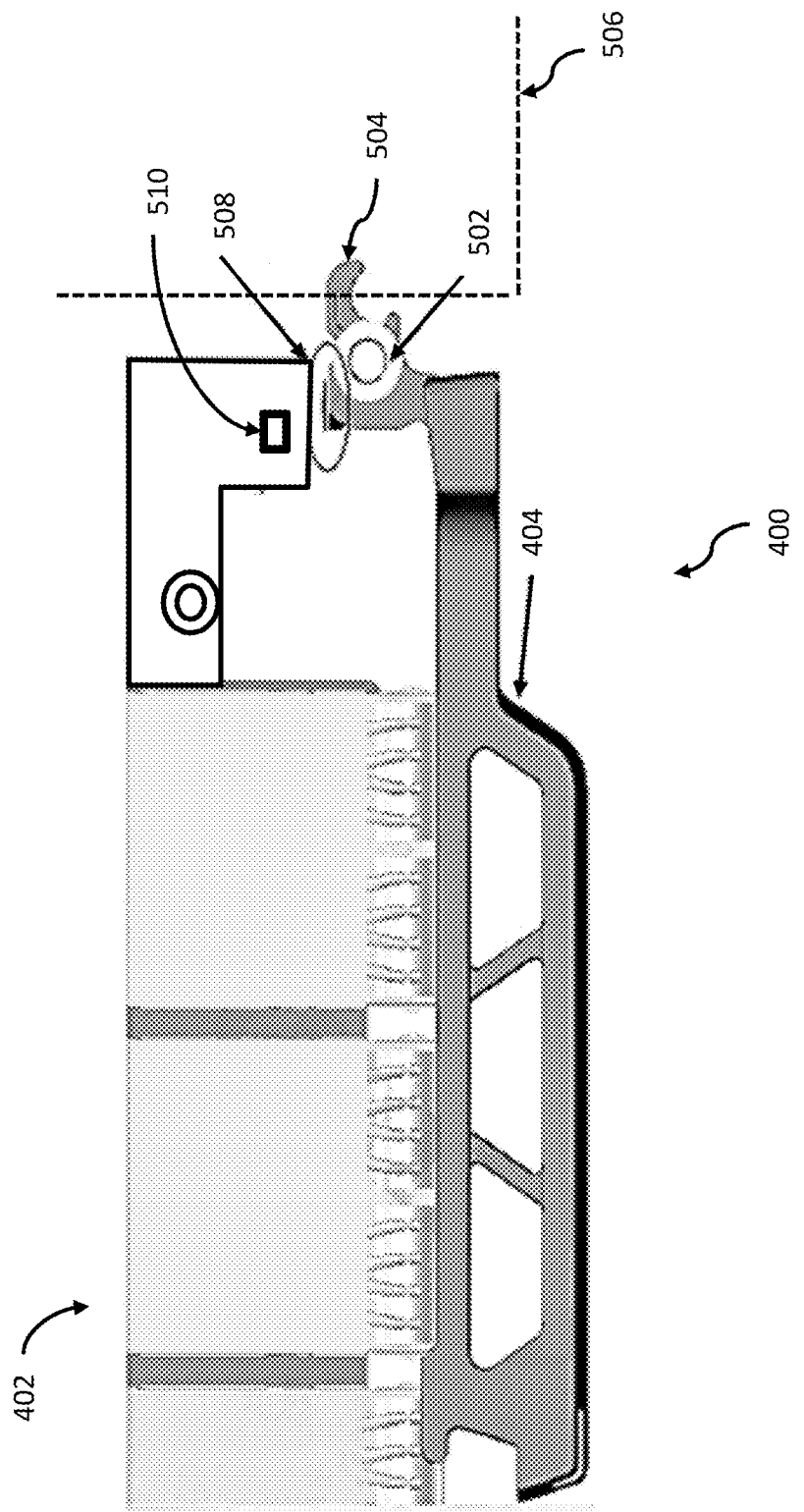

FIGS. 5A and 5B show a close-up view of a portion of one of server sleds 402 with a lever 404 in an open position and a closed position, respectively. As shown in FIGS. 5A and 5B, each of levers 404 is configured to rotate about a rotation shaft 502. In the open position of FIG. 5A, the lever 404 rotates so that a hook 504 disengages from a hook opening (not shown) on the wall 506 of the chassis 400. At this point, a user can grasp the levers 404 to pull the sled 402 out of the chassis 400. To insert the sled 402, the sled 402 can be pushed back into chassis 400 by the user. Once the sled 402 is properly positioned in the chassis 400, the levers 404 can rotate about shaft 502. This causes the hook 504 to engage the hook opening in the wall 506, securing the sled 402 in the chassis 400.

In a typical sled arrangement, the position of the levers 404 would be monitored for various reasons. For example, the chassis 400 and/or the sled 402 may be configured to prevent power-up of the sled 402 unless the sled is properly secured—that is both levers 404 associated with the sled 402 are in the closed position. In another example, the sled 402 may be configured to take action when one of the levers 404 is moved to the open position. In that case, the sled 402 may be configured to take action to prevent data loss in the face of imminent removal of the sled 402. Therefore, the sled can be configured to commence a shutdown mode or enter a sleep mode when at least one of the levers 404 is rotated out of closed position. In some cases, the sled 402 may even be configured to transfer active processes or applications to another sled.

In a conventional system, the position of the sleds 402 is typically monitored via a button or switch. For example, when the lever 404 is in a closed position, the lever 404 would be configured to push against a button or switch. The button or switch would close a circuit to cause a signal to be provided to indicate the lever 404 is closed. When the lever 404 is in the open position, the lever 402 would no longer push against the button or switch, and thereby opening the circuit and discontinuing the signal indicating the lever 404 is closed (alternatively construed as a signal indicating the lever 402 is in the open position). The sled 402 would then take appropriate action.

However, the conventional approach of a button or switch is problematic. First of all, mechanical parts typically have low reliability. That is, a button or switch is prone to failure with repeated use. Second, a button or switch typically requires a significant amount of space within the sled 402. As such, the switch or button would potentially occupy space in the sled 402 that can be used for other components. In view of such issues, a magnetic sensing system can be applied in such circumstances to provide a more compact and reliable sensing system. This is illustrated in FIGS. 5A and 5B.

As shown in FIG. 5A and 5B, the lever 402 can be configured to include a magnetic portion 508. For example, the magnetic portion 508 can be a magnet embedded into the lever 404. The magnetic portion 508 can also be a coil element, or the like, that generates a magnetic field, but would require additional wiring embedded into the lever 404 to energize the coil element. The sled 402 can be configured to include a corresponding magnetic field sensor 510. The magnetic field sensor 510 can be configured, at the least, to detect the presence of a magnetic field within a sensing region (not shown for clarity of illustration). The magnetic field sensor 510 can be coupled to a controller or other component that receives the signals generated by sensor when magnetic portion 508 comes within the sensing region. For example, the magnetic field sensor 510 can be connected to controller or similar component, similar to the arrangement illustrated in FIG. 3.

In operation, when the lever 404 is rotated to the closed position, as shown in FIG. 5B, the lever 404 would rotate the magnetic portion 508 into the sensing area of the magnetic field sensor 510. The magnetic field sensor 510 then causes a first signal to be generated to indicate the lever 404 is closed. When the lever 404 is rotated into the open position, as shown in FIG. 5A, the magnetic portion 508 is rotated out of the sensing region of the magnetic field sensor 510. In the absence of the magnetic field, the magnetic field sensor 510 generates a second signal to indicate the lever 404 is in the open position. Based on the signals being generated by the magnetic field sensor 510, the sled 402 can take appropriate action, as discussed above.

The foregoing configuration eliminates mechanical components, thus improving reliability. First, as previously noted, a magnetic field sensor is not susceptible to mechanical failure and thus can be used repeatedly without wearing out. Second, a magnetic field sensor can operate in harsher environments. For example, such a sensor should be operable over a wider range of temperatures, humidity, and other environmental factors and will typically not be as susceptible to rusting or other types of corrosion. Further, as magnetic field sensors can be obtained in relatively smaller sizes than button or switch devices, a substantial space savings can be provided. As such, a more compact and reliable sensing system is provided.

Although the configuration of FIGS. 4, 5A, and 5B is directed to a specific application, the various embodiments are not limited in this regard. Rather, the use of magnet/sensor pairs can also be used to detect the position of any other type of component. Moreover, even though the configuration of FIGS. 4, 5A, and 5B is directed to detecting whether a component is in one or two positions, the various embodiments are not limited in this regard. Rather, a similar methodology can be utilized to detect multiple positions for components.

For example, referring back to the lever arrangement of FIGS. 4, 5A, and 5B, multiple magnet/sensor pairs can be positioned so that in a closed position, the magnetic field of each magnet is within the sensing area of a magnetic field sensor. The magnet/sensor pairs can also be positioned so that in an open position, the magnetic field of none of the magnets is within the sensing area of the magnetic field sensor. Additionally, the magnet/sensor pairs can also be positioned so that in a partially open position, the magnetic field of some of the magnets is within the sensing area of some the magnetic field sensors. As such, the magnetic field sensors would indicate one or more intermediate positions for the lever based on which sensors are detecting a magnetic field.

In another configuration, the number of magnets can be less than the number of sensors. For example, one magnet can be used with multiple sensors in a lever arrangement. In such a configuration, the position of the lever can be discerned depending on which sensor is currently detecting the magnetic field of the magnet.

In still another configuration, the number of sensors can be less than the number of magnets. For example, one sensor can be used with two magnets of different polarities. In such a configuration, the position of the lever can be discerned depending on whether the sensor is detecting a magnetic field and what the polarity of the magnetic field is.

It should be noted that while a rotating lever-type arrangement is used for illustrating the arrangement of FIGS. 4, 5A, 5B, and variations thereof, the various embodiments are not limited in this regard. That is, the arrangements of magnets and sensors describes above can also be used to detect a position of components with linear motion, components with a combination of linear and rotary motion, or components with any other type of motion.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A computing device, comprising:
   a first component comprising a magnetic field sensor with a sensing region;
   a second component comprising a magnetic portion, the second component being movable between a first position relative to the first component and one or more second positions relative to the first component; and
   a controller communicatively coupled to the magnetic field sensor,
   wherein the magnetic portion is positioned in the sensing region when the second component is in the first position, and the magnetic portion is not positioned in the sensing region when the second component is in the one or more second positions,
   wherein the magnetic field sensor is configured for generating one or more first signals in response to detecting any magnetic field within the sensing region, the one or more first signals indicating that the magnetic portion is within the sensing region,
   wherein the controller is configured for generating a second signal in response to the first signals indicating the second component is in the first position.

2. The computing device of claim 1, wherein the second component is detachable from the first component.

3. The computing device of claim 1, wherein the second component is rotatable relative to the first component.

4. The computing device of claim 1, wherein the magnetic field sensor is further configured for detecting a polarity of the magnetic portion, and wherein the one or more first signals are configured to indicate a polarity of the magnetic portion.

5. The computing device of claim 4, wherein the controller generates the second signals in a first configuration in response to the first signals indicating a first polarity for the magnetic portion and in a second configuration in response to the first signals indicating a second polarity for the magnetic portion.

6. The computing device of claim 5, wherein the controller is further configured for:
   detecting that the second signals fail to match a target polarity signal;
   in response to detecting that the second signals fail to match the target polarity signal, generating an error signal.

7. The computing device of claim 1, wherein the magnetic field sensor is configured for generating one or more third signals in response to failing to detect the magnetic portion in the sensing region, and wherein the controller is further configured for generating a fourth signal in response to the third signals indicating that the second component is not in the first position.

8. The computing device of claim 1, wherein the magnetic field sensor is configured for generating one or more third signals in response to failing to detect the magnetic portion in the sensing region, and wherein the controller is further configured for generating a fourth signal in response to the third signals indicating that the component is absent.

9. A method for detecting a configuration of a computing device comprising a first component comprising a magnetic field sensor with a sensing region and a second component comprising a magnetic portion, the second portion configured to be movable between a first position relative to the first component and one or more second positions relative to the first component such that the magnetic portion is positioned in the sensing area when the second component is in the first position and not positioned in the sensing region when the second component is in the one or more second positions, the method comprising:
   receiving, from the magnetic field sensor, one or more first signals indicating a presence of any magnetic field within the sensing region;
   detecting receipt of the first signals; and
   in response to detecting the receipt of the first signals, generating a second signal in response to the first signals indicating that the second component is in the first position.

10. The method of claim 9, wherein the magnetic field sensor is further configured for detecting a polarity of the magnetic portion, wherein the one or more first signals further indicate a polarity of the magnetic portion, and wherein the detecting comprises identifying a polarity of the magnetic portion based on the first signals.

11. The method of claim 10, wherein the second signals are generated in a first configuration in response to the first signals indicating a first polarity for the magnetic portion and generated in a second configuration in response to the first signals indicating a second polarity for the magnetic portion.

12. The method of claim 11, further comprising:
   detecting that the second signals fail to match a target polarity signal;
   in response to detecting that the second signals fail to match the target polarity signal, generating an error signal.

13. The method of claim 9, wherein the magnetic field sensor is configured for generating one or more third signals in response to failing to detect the magnetic portion in the sensing region, and wherein the method further comprises generating a fourth signal in response to the third signals indicating that the second component is not in the first position.

14. A computing device, comprising:
   a chassis comprising at least one receiving space for receiving a component;
   a circuit board disposed in the chassis;
   a controller disposed on the circuit board;

at least one board connector disposed on the circuit card, the board connector configured to mate with a connector of a component inserted into the receiving space;

a magnetic field sensor disposed on the circuit board and communicatively coupled the controller, the magnetic field sensor having a sensing region extending into a portion of the receiving space such that a position of a magnetic portion of a component is positioned in the sensing region when the component is fully inserted into the receiving space and the magnetic portion of the component is not positioned in the sensing region when the component is not fully inserted into the receiving space, wherein the magnetic field sensor is configured for generating one or more first signals in response to detecting any magnetic field within the sensing region, wherein the controller is configured for generating a second signal in response to the first signals indicating the second component is in the first position.

15. The computing device of claim 14, wherein the magnetic field sensor is further configured for detecting a polarity of the magnetic portion, and wherein the one or more first signals are configured to indicate a polarity of the magnetic portion.

16. The computing device of claim 15, wherein the controller generates the second signals in a first configuration in response to the first signals indicating a first polarity for the magnetic portion and in a second configuration in response to the first signals indicating a second polarity for the magnetic portion.

17. The computing device of claim 16, wherein the controller is further configured for:
   detecting that the second signals fail to match a target polarity signal for the component;
   in response to detecting that the second signals fail to match the target polarity signal, generating an error signal.

18. The computing device of claim 17, wherein the component is a fan, and wherein the target polarity signal indicates a direction required for the fan in the computing device.

* * * * *